(12) United States Patent
Lee et al.

(10) Patent No.: US 11,145,534 B2
(45) Date of Patent: Oct. 12, 2021

(54) SUPPORT UNIT AND SUBSTRATE TREATING APPARATUS COMPRISING THE SAME

(71) Applicant: SEMES CO., LTD., Cheonan-si (KR)

(72) Inventors: Seung Pyo Lee, Chungcheongnam-do (KR); Hyung Joon Kim, Gyeonggi-do (KR)

(73) Assignee: SEMES CO., LTD., Cheonan-si (KR)

( * ) Notice: Subject to any disclaimer, the term of this patent is extended or adjusted under 35 U.S.C. 154(b) by 169 days.

(21) Appl. No.: 16/194,014

(22) Filed: Nov. 16, 2018

(65) Prior Publication Data
US 2019/0157130 A1 May 23, 2019

(30) Foreign Application Priority Data
Nov. 17, 2017 (KR) .................. 10-2017-0153615

(51) Int. Cl.
| | |
|---|---|
| H01J 37/32 | (2006.01) |
| H01L 21/67 | (2006.01) |
| H01L 21/683 | (2006.01) |
| H01L 21/687 | (2006.01) |

(52) U.S. Cl.
CPC .... *H01L 21/68742* (2013.01); *H01J 37/3244* (2013.01); *H01J 37/32715* (2013.01); *H01L 21/67017* (2013.01); *H01L 21/67109* (2013.01); *H01L 21/6831* (2013.01); *H01L 21/6833* (2013.01); *H01J 2237/2001* (2013.01); *H01J 2237/2007* (2013.01)

(58) Field of Classification Search
None
See application file for complete search history.

(56) References Cited

U.S. PATENT DOCUMENTS

| | | | | |
|---|---|---|---|---|
| 2008/0014363 A1* | 1/2008 | Sago | ........ | H01L 21/6831 427/458 |
| 2010/0163403 A1* | 7/2010 | Kitada | ........ | H01L 21/68742 204/164 |
| 2014/0265090 A1* | 9/2014 | Hou | ........ | H01L 21/68785 269/14 |

(Continued)

FOREIGN PATENT DOCUMENTS

| | | |
|---|---|---|
| JP | 2010-153678 A | 7/2010 |
| JP | 2015-023041 A | 2/2015 |

(Continued)

OTHER PUBLICATIONS

Office Action for related Korean Patent Application No. 10-2017-0153615 dated May 14, 2019 (7 pages).

(Continued)

*Primary Examiner* — Karla A Moore
*Assistant Examiner* — Tiffany Z Nuckols
(74) *Attorney, Agent, or Firm* — Procopio, Cory, Hargreaves & Savitch LLP (57) ABSTRACT

Disclosed are a support unit and a substrate treating apparatus comprising the same. The inventive concept provides a support unit that may prove temperature uniformity between facing areas on a substrate the other areas of the substrate and may solve a problem of not easily separating a substrate by a negative pressure in a pin hole when the substrate is separated from the support unit, and a substrate treating apparatus.

10 Claims, 6 Drawing Sheets

(56) References Cited

U.S. PATENT DOCUMENTS

| | | | |
|---|---|---|---|
| 2015/0187625 A1* | 7/2015 | Busche | H05K 7/20218 |
| | | | 361/234 |
| 2016/0064189 A1* | 3/2016 | Tandou | H01J 37/32192 |
| | | | 156/345.33 |
| 2017/0278730 A1* | 9/2017 | Tandou | H01L 21/68742 |

FOREIGN PATENT DOCUMENTS

| | | |
|---|---|---|
| JP | 2016-100414 A | 5/2016 |
| KR | 10-1216701 B1 | 12/2012 |
| KR | 10-2014-0087986 A | 7/2014 |
| KR | 10-2015-0025903 A | 3/2015 |
| KR | 10-1569886 B1 | 11/2015 |
| KR | 10-2016-0134930 A | 11/2016 |

OTHER PUBLICATIONS

Final Office Action for related Korean Patent Application No. 10-2017-0153615 dated Jan. 16, 2020 (8 pages).

\* cited by examiner

SUPPORT UNIT AND SUBSTRATE TREATING APPARATUS COMPRISING THE SAME

CROSS-REFERENCE TO RELATED APPLICATIONS

This application claims priority under 35 U.S.C. § 119 to Korean Patent Application No. 10-2017-0153615 filed on Nov. 17, 2017, in the Korean Intellectual Property Office, the disclosures of which are incorporated by reference herein in their entireties.

BACKGROUND

Embodiments of the inventive concept described herein relate to a support unit and a substrate treating apparatus comprising the same, and more particularly, to a support unit that supplies a heat transfer gas to a bottom surface of a substrate positioned on the support unit and a substrate treating apparatus comprising the same.

In order to manufacture a semiconductor device, various processes, such as an etching process, a deposition process, an ashing process, and annealing process, of treating a substrate by using plasma are required. In the plasma treatment process, a substrate is treated by generating plasma from a process gas supplied into the interior of the process chamber and allowing the plasma to react with the substrate.

Figure 1:
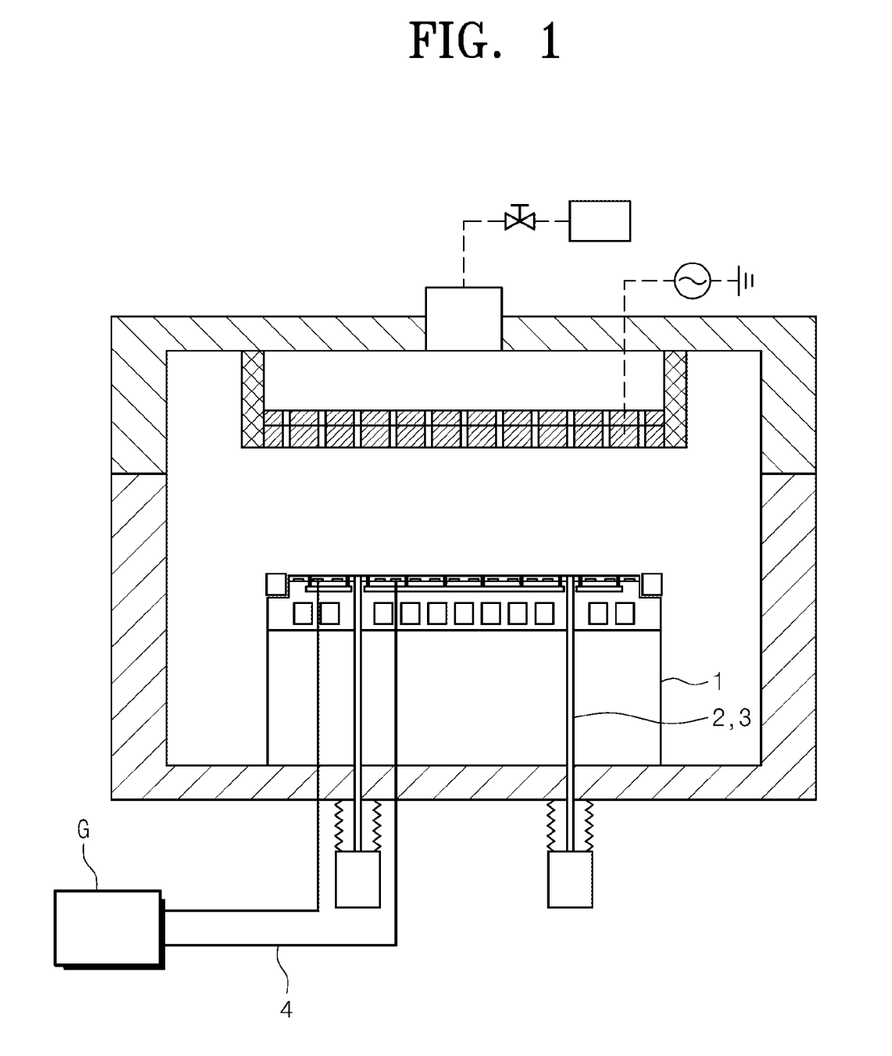
FIG. 1 is a view schematically illustrating a general plasma substrate treating apparatus.

In general, as illustrated in FIG. 1, a plasma treatment apparatus has a support unit 1 configured to support a substrate by using an electrostatic force. A lift pin 2 is provided in the support unit 1 such that an external substrate may be sent and received between the support unit 1 and a robot that transports the substrate. The lift pin 2 is moved upwards and downwards along a pin hole 3 formed in the support unit 1 in a state in which the lift pin 2 is inserted into the pin hole 3.

Further, a gas line 4, through which a heat transfer gas, such as helium, is supplied to a space between a bottom surface of the substrate and an upper surface of the support unit 1 such that the temperature of the substrate may be uniformly maintained as a whole. The heat transfer gas is supplied to a bottom surface of the substrate through the gas line 4 formed in the support unit 1.

However, it is difficult for the heat transfer gas to exist on an upper side of the pin hole 3 because the interior of the pin hole 3 is maintained in a vacuum or low-pressure state during the substrate treating process through plasma, and accordingly, a temperature uniformity of an area of the substrate, which faces the pin hole 3 is lower than those of the other areas.

Figure 2:
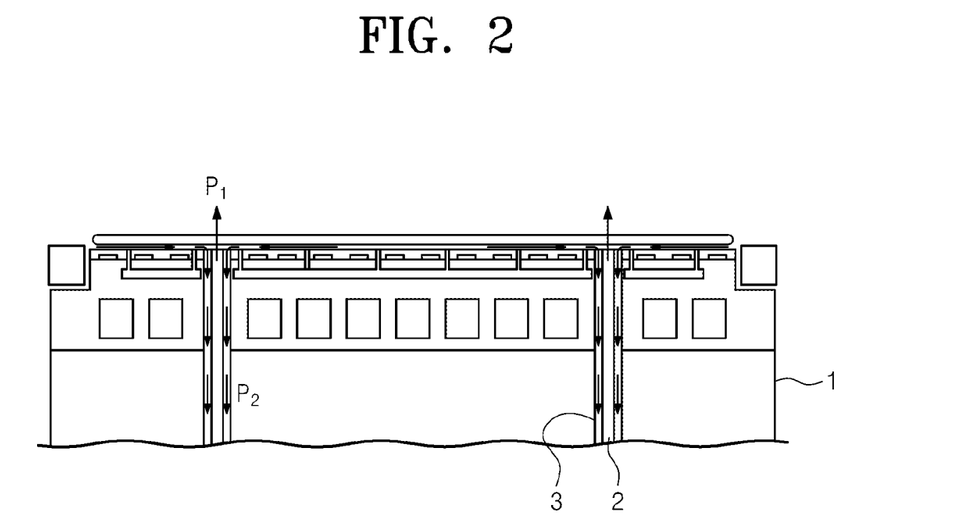
FIG. 2 is a view illustrating a problem occurring when the apparatus of FIG. 1 is used.

Further, as illustrated in FIG. 2, because the interior of the pin hole 3 is maintained in a vacuum or low-pressure state when the substrate is separated from the support unit 1 by using the lift pin 2, a force P2 is applied to the substrate in a direction that is opposite to the direction of a force P1 by which the lift pin 2 lifts the substrate, and accordingly, the substrate may be damaged.

SUMMARY

Embodiments of the inventive concept provide a support unit that may prove temperature uniformity between facing areas on a substrate the other areas of the substrate, and a substrate treating apparatus.

Embodiments of the inventive concept also provide a support unit that may solve a problem of not easily separating a substrate by a negative pressure in a pin hole when the substrate is separated from the support unit, and a substrate treating apparatus.

The problems that are to be solved by the inventive concept are not limited to the above-mentioned problems, and the unmentioned problems will be clearly understood by those skilled in the art to which the inventive concept pertains from the specification and the accompanying drawings.

The inventive concept provides a substrate treating apparatus. According to an embodiment, the substrate treating apparatus comprise a chamber providing a treatment space to the interior of the substrate treating apparatus, a support unit located in the treatment space and on which a substrate is positioned, a gas supply unit configured to eject a process gas into the treatment space, and a plasma generating unit configured to generate plasma from the process gas, wherein the support unit comprises a gas line formed in the support unit to supply a heat transfer gas between the substrate positioned on the support unit and the support unit, a lift pin configured to elevate through a pin hole formed in the support unit and configured to deliver the substrate to the support unit or receive the substrate from the support unit, and a supply line configured to supply a gas to the pin hole.

The supply line may be branched from the gas line and the gas supplied to the pin hole is the heat transfer gas.

The heat transfer gas may be helium.

A valve configured to open and close the interior of the supply line may be installed in the supply line.

A ventilation line that vents the gas in the interior of the pin hole may be connected to the pin hole and a valve that opens and closes the interior of the ventilation line is installed in the ventilation line.

The ventilation line may be configured to vent the gas into the treatment space.

The support unit may comprise an electrostatic chuck configured to suction the substrate by an electrostatic force, an electrode plate disposed below the electrostatic chuck, and an insulation plate disposed below a cooling plate, and the supply line may be disposed in the insulation plate.

A plurality of pin holes may be provided in the support unit and a plurality of supply lines may be provided in the pin holes, respectively.

The inventive concept provides a support unit that supports a substrate. According to an embodiment, the support unit comprises a gas line formed in the support unit to supply a heat transfer gas between a bottom surface of the substrate positioned on the support unit and an upper surface of the support unit, a lift pin configured to elevate through a pin hole formed in the support unit and configured to deliver the substrate to the support unit or receive the substrate from the support unit, and a supply line configured to supply a gas to the pin hole.

The support unit may comprise an electrostatic chuck configured to suction the substrate by an electrostatic force, an electrode plate disposed under the electrostatic chuck, and an insulation plate disposed below the cooling plate, the gas line may be configured to pass thorough the electrostatic chuck, the electrode plate, and the insulation plate, and the lift pin may be configured to elevate through a pin hole extending from the electrostatic chuck to the insulation plate in the interior thereof.

The supply line may be branched from the gas line and a valve configured to open and close the interior of the supply line may be installed in the supply line.

A ventilation line that vents the gas in the interior of the pin hole may be connected to the pin hole and a valve that opens and closes the interior of the ventilation line may be installed in the ventilation line.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments.

The embodiments of the inventive concept are provided to describe the inventive concept for those skilled in the art more completely. Accordingly, the shapes of the components of the drawings are exaggerated to emphasize clearer description thereof.

Hereinafter, a substrate treating apparatus according to an embodiment of the inventive concept will be described with reference to the accompanying drawings.

Figure 3:
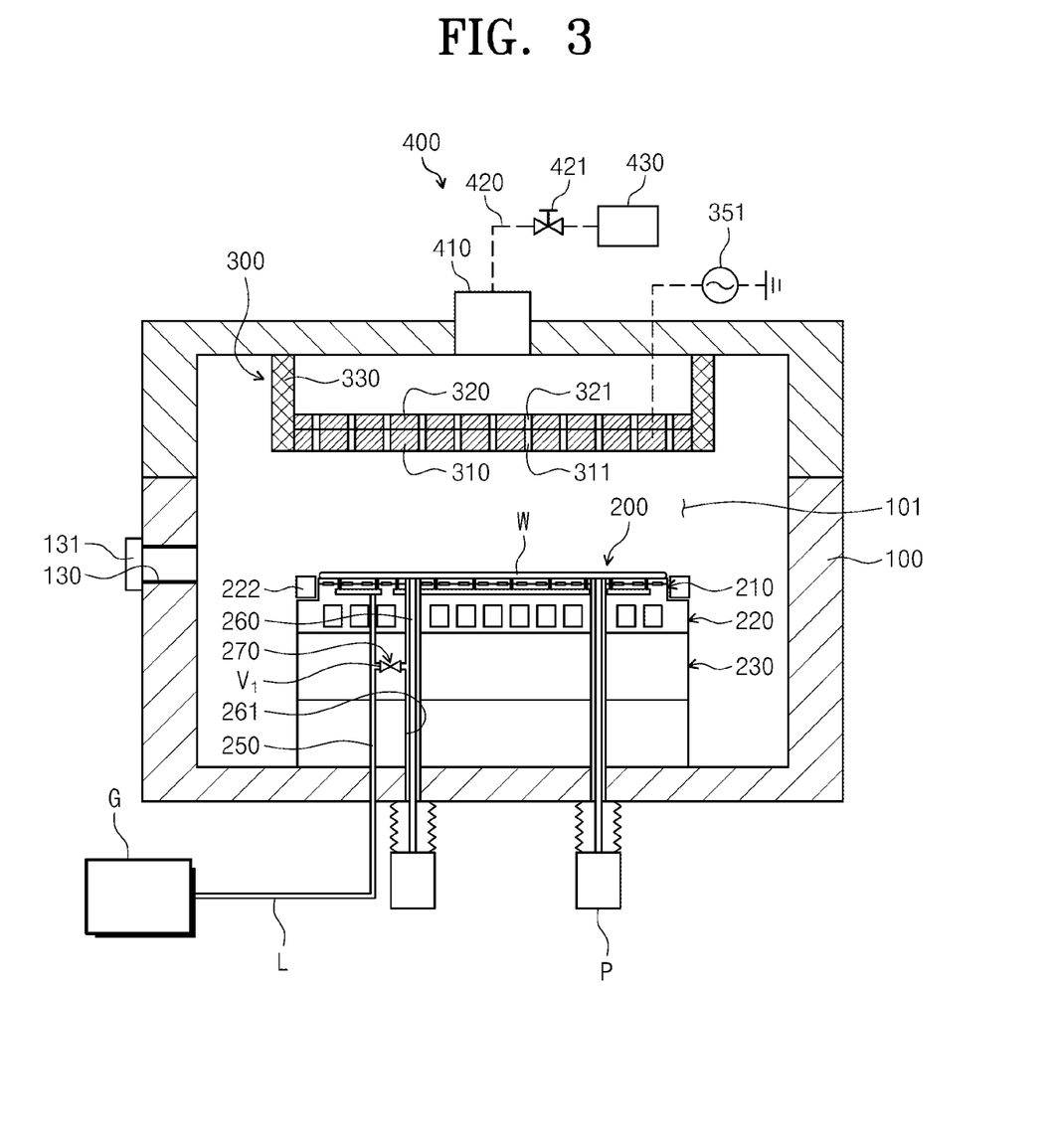
FIG. 3 is a sectional view illustrating a substrate treating apparatus according to an embodiment of the inventive concept.
Figure 4:
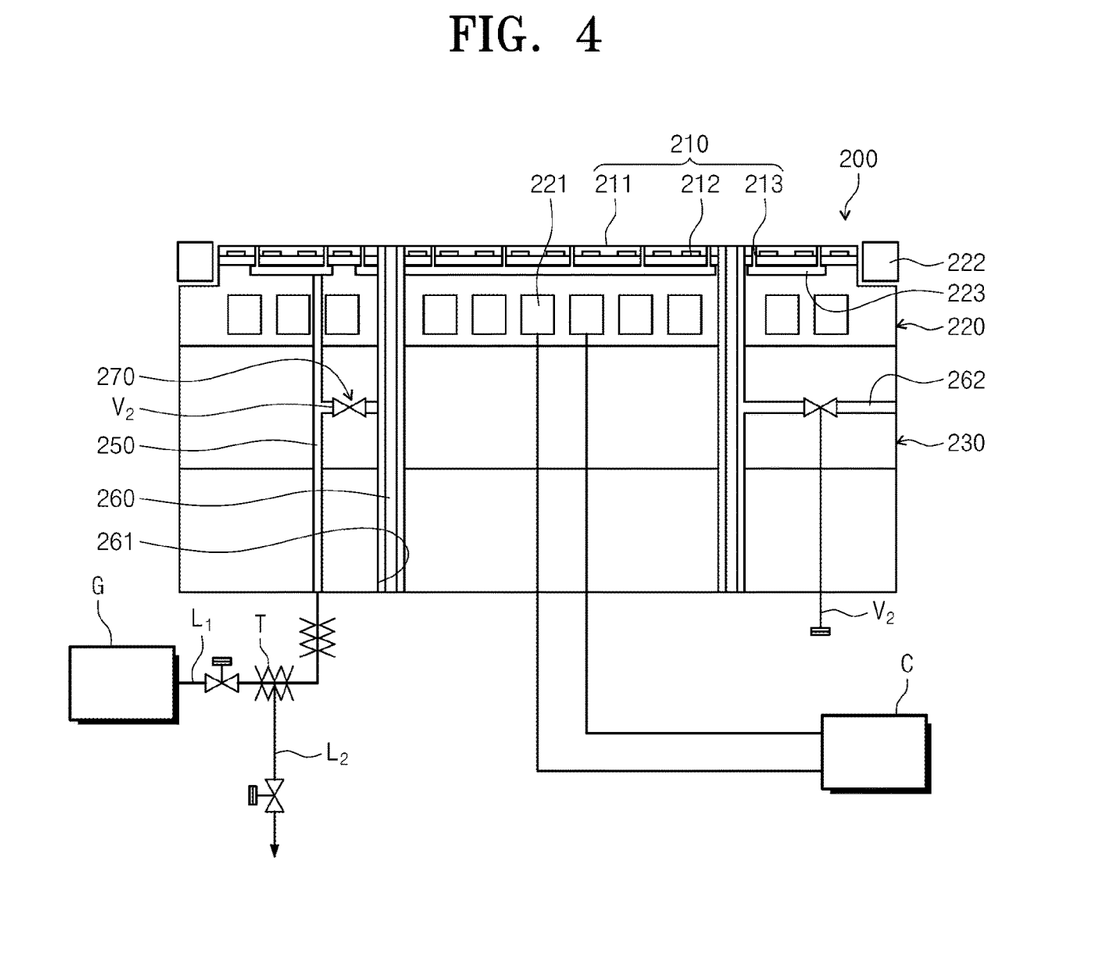
FIG. 4 is a sectional view illustrating a support unit provided in the substrate treating apparatus of FIG. 3.

FIG. 3 is a sectional view illustrating a substrate treating apparatus according to an embodiment of the inventive concept. FIG. 4 is a sectional view illustrating a support unit provided in the substrate treating apparatus of FIG. 3. As illustrated in FIGS. 3 and 4, the substrate treating apparatus according to an embodiment of the inventive concept comprises a chamber 100, a support unit 200, a plasma generating unit 300, and a gas supply unit 400.

The process chamber 100 provides a treatment space 101 in which a substrate treating process is performed, in the interior thereof. The process chamber 100 is formed of a metallic material. As an example, the process chamber 100 may be formed of aluminum. The process chamber 100 may be grounded. An exhaust hole (not illustrated) is formed on a bottom surface of the process chamber 100. The exhaust hole is connected to an exhaust line. The reaction side-products generated in the process and process gases left in the interior space of the process chamber 100 may be exhausted to the outside through the exhaust line. Through the exhaustion process, the pressure of the interior of the process chamber 100 is reduced to a specific pressure.

An introduction hole 130, through which a substrate is introduced and extracted, is formed on one side wall of the chamber 100. The introduction hole 130 is provided in the body 110. The introduction hole 130 is provided as a passage, through which the substrate W may be introduced into and extracted from the interior of the process chamber 100. The introduction hole 130 is opened and closed by a door 131 located outside the process chamber 100.

The support unit 200 comprises an electrostatic chuck 210, an electrode plate 220, an insulation plate 230, a gas line 250, a lift pin 260, and a supply line 270.

The electrostatic chuck 210 comprises a dielectric plate 211 and an electrode 212. The dielectric plate 211 is located at an uppermost end of the support unit 200, and the substrate W is positioned on the dielectric plate 211.

The dielectric plate 211 is formed of ceramics. A plurality of bosses are provided on an upper surface of the dielectric plate 211. The plurality of bosses provided in the dielectric plate 211 provide a space 213 in which a heat transfer gas flows between the substrate W and the dielectric plate 211 when the substrate W is positioned on the dielectric plate 211. The bosses have a ring shape, and the space 213 may be divided into a plurality of areas by the bosses.

The electrode 212 is located in the interior of the dielectric plate 211. A DC current is applied is applied to the electrode 212, the substrate W is suctioned on the electrostatic chuck 210 by an electrostatic force.

The electrode plate 220 is located below the electrostatic chuck 210. The electrode plate 220 may be grounded or a high-frequency power source may be connected to the electrode plate 220.

A refrigerant passage 221, through which cooling water flows, is provided in the interior of the electrode plate 220. The cooling water allows the substrate W to maintain a preset temperature during or after a process.

A focus ring 222 is mounted on a peripheral portion of the electrode plate 220. The focus ring 222 guides a process gas that is present on an upper side of the peripheral portion of the electrode plate 220 to the substrate W.

A distribution line 223 communicates with the space 213 provided in the dielectric plate 211 and the gas line 250 such that the gas is supplied into the space 213. An insulation plate 230 is located below the electrode plate 220. The insulation plate 230 may be formed of aluminum oxide ($Al_2O_3$).

The gas line 250, through which the heat transfer gas is supplied into the space 213 between the bottom surface of the substrate W and the upper surface of the electrostatic chuck 210, is formed in the electrostatic chuck 210, the electrode plate 220, and the insulation plate 230.

A gas supply pipe L1, through which the heat transfer gas is supplied from an external gas supply source, is connected to the gas line 250. A thermostat T that heats the heat transfer gas may be installed in the gas supply pipe L1.

A ventilation line L2, through which the heat transfer gas is vented from the gas line 250, is branched from the gas supply line L1. If the substrate treating process is completed, a pressure between the substrate W and the electrostatic chuck 210 is made to be the same as an internal pressure of the chamber 100 by opening the ventilation line L2 before the substrate W is separated from the electrostatic chuck 210.

The lift pin 260 may be configured to the transportation robot (not illustrated) that transports the substrate W and the support unit 200 may send and receive the substrate W. A pin hole 261 is formed in the support unit 200, and the lift pin 260 is configured to elevate along the pin hole 261.

According to an embodiment, the pin hole 261 extends from the electrostatic chuck 210 to the insulation plate 230. Three lift pins 260 may be provided.

The supply line 270 supplies the gas to the pin hole 261. According to an embodiment, the gas may be the same as the heat transfer gas. According to an embodiment, the supply line 270 is branched from the gas line 250 and is connected to the pin hole 261. A plurality of supply lines 270 are branched from the gas line 250 and are connected to the pin holes 261 such that the heat transfer gas may be supplied to the pin holes 261. According to an example, the supply line 270 may be formed in the insulation plate 230.

A valve V1 that opens and closes the interior of the supply line 270 is provided in the supply line 270. Due to the operation of the valve V1, a portion of the heat transfer gas supplied into the space 213 through the gas line 250 may be optionally supplied to the pin hole 261. When the heat transfer gas supplied to the pin hole 261 flows back, the amount of the heat transfer gas that is present in the pin hole 261 may be maintained constantly by closing the valve V1.

The ventilation line 262 is connected to the pin hole 261. The ventilation line 262 may vent the heat transfer gas in the pin hole 261 to the outside. According to an example, the ventilation line 262 may be configured to vent the heat transfer gas in the pin hole 261 to the treatment space 101. Because the ventilation line 262 is provided in the pin hole 261, the heat transfer gas supplied to the pin hole 261 may be vented more rapidly.

A valve V2 is provided in the ventilation line 262 to open and close the interior of the ventilation line 262. When the valve V2 is opened, the heat transfer gas that is present in the interior of the pin hole 261 may be vented more rapidly.

Because the ventilation line 262 is operated after being combined with the ventilation line L2 before the substrate W is separated from the electrostatic chuck 210, an internal pressure of the pin hole 261 is maintained at the internal pressure of the chamber 100.

The plasma generating unit 300 excites a process gas in the process chamber 100 into a plasma state. A capacitive coupled plasma (CCP) unit is used as the plasma generating unit 300.

The capacitive coupled plasma unit may comprise an upper electrode and a lower electrode in the interior of the process chamber 100. The upper electrode and the lower electrode may be vertically disposed in parallel to each other in the process chamber 100.

High-frequency power may be applied to any one of the electrodes, and the other electrode may be grounded. An electromagnetic field may be formed in a space between the two electrodes, and the process gas supplied into the space may be excited into a plasma state.

A substrate treating process is performed by using the plasma. According to an example, the upper electrode may be provided to the shower head 310 and the lower electrode may be provided to the electrode plate 220. High-frequency power may be applied to the lower electrode and the upper electrode may be grounded. Unlike this, high-frequency power may be applied to both the upper electrode and the lower electrode. Accordingly, an electromagnetic field is generated between the upper electrode and the lower electrode. The generated electromagnetic field may excite the process gas provided into the process chamber 100 into a plasma state.

The plasma generating unit 300 is located above the support unit 200 in the interior of the process chamber 100. The plasma generating unit 300 is located to face the support unit 200.

The plasma generating unit 300 comprises a shower head 310, a gas ejecting plate 320, and a support part 330. The shower head 310 is located to be spaced downwards apart from the upper surface of the chamber 100 by a specific distance. A space may be formed between the gas ejecting plate 310 and the upper surface of the chamber 100. The shower head 310 may have a plate shape having a specific thickness.

The bottom surface of the shower head 310 may be anodized to prevent generation of an arc by plasma. The shower head 310 may have the same shape and cross-section as those of the support unit 200. The shower head 310 comprises a plurality of ejection holes 311. The ejection holes 311 may vertically pass through the upper surface and the lower surface of the shower head 310. The shower head 310 is formed of a metallic material.

The gas ejecting plate 320 is provided on an upper surface of the shower head 310. The gas ejecting plate 320 is located to be spaced downwards apart from the upper surface of the chamber 100 by a specific distance. The gas ejecting plate 320 may have a plate shape having a specific thickness. An ejection holes 321 are provided in the gas ejecting plate 320.

The ejection hole 321 may vertically pass through the upper surface and the lower surface of the gas ejecting plate 320. The ejection hole 321 is located to be opposite to the ejection holes 311 of the shower head 310. The gas ejecting plate 320 may comprise a metallic material.

The shower head 310 may be electrically connected to an upper power source 351. The upper power source 351 may be provided as a high-frequency power source. Unlike this, the shower head 310 may be electrically grounded. The shower head 310 may be electrically connected to an upper power source 351. Unlike this, the shower head 310 is grounded to function as an electrode.

The support part 330 supports sides of the shower head 310 and the gas ejection plate 320. An upper end of the support part 330 is connected to the upper surface of the chamber 100, and a lower end of the support part 310 is connected to the side of the shower head 310 and the side of the gas ejecting plate 320. The body 330 may comprise a nonmetallic plate.

The gas supply unit 400 supplies a process gas into the process chamber 100. The gas supply unit 400 comprises a gas supply nozzle 410, a gas supply line 420, and a gas storage unit 430.

The gas supply nozzle 410 is installed at a central portion of the process chamber 100. An ejection hole is formed on the bottom surface of the gas supply nozzle 410. The ejection hole supplies the process gas into the process chamber 100.

The gas supply unit 420 connects the gas supply nozzle 410 and the gas storage unit 430. The gas supply line 420 supplies the process gas stored in the gas storage unit 430 to the gas supply nozzle 410. A valve 421 is installed in the gas supply line 420. The valve 421 opens and closes the gas supply line 420, and adjusts a flow rate of the process gas supplied through the gas supply line 420.

The support unit and the substrate treating apparatus comprising the same according to an embodiment of the inventive concept have been described in detail. However, the inventive concept is not limited to the above-mentioned examples, and may be applied to all apparatuses that treat the substrate W through plasma.

In particular, according to occasions, the gas line 250 may be divided into a first line (not illustrated) that supplies a gas to a central portion of the substrate W and a second line (not illustrated) that supplies the gas to a peripheral portion of the substrate W.

With a configuration that is different from the above-mentioned plasma generating unit 300, the process gas supplied to the chamber 100 may be modified to plasma.

Further, a baffle (not illustrated) may be provided to the chamber 100 to surround the support unit 200. A slit having a specific shape is provided in the baffle, and an amount of the process gas that is compulsorily exhausted from the treatment space 101 through the baffle is adjusted.

The exhaust hole provided in the chamber 100 is connected to the exhaust line (not illustrated), and the exhaust line is connected to a vacuum pump (not illustrated).

With the compulsory exhaustion by the vacuum pump, the interior of the process chamber 100 may be maintained at a pressure that is lower than the atmospheric pressure. Further, the reaction side-products generated in the process and process gases left in the interior space of the process chamber 100 may be exhausted to the outside through the exhaust line.

According to an embodiment of the inventive concept, because the heat treating gas supplied between the substrate W and the support unit 200 through the gas line 250 is also supplied to the pin hole 261, the heat treating gas is also present on the upper side of the pin hole 261 during the substrate treating process through plasma, and as a result, the entire area of the substrate may become a uniform temperature.

Further, because a pressure of a space between the substrate W and the support unit 200 and a pressure of a space outside the substrate may be made to coincide with each other by adjusting exhaustion of the heat treating gas that is present in the gas line 250 and the pin hole 261 when the substrate is separated from the support unit 200, generation of a negative pressure on the lower surface of the substrate W may be prevented.

Figure 5:
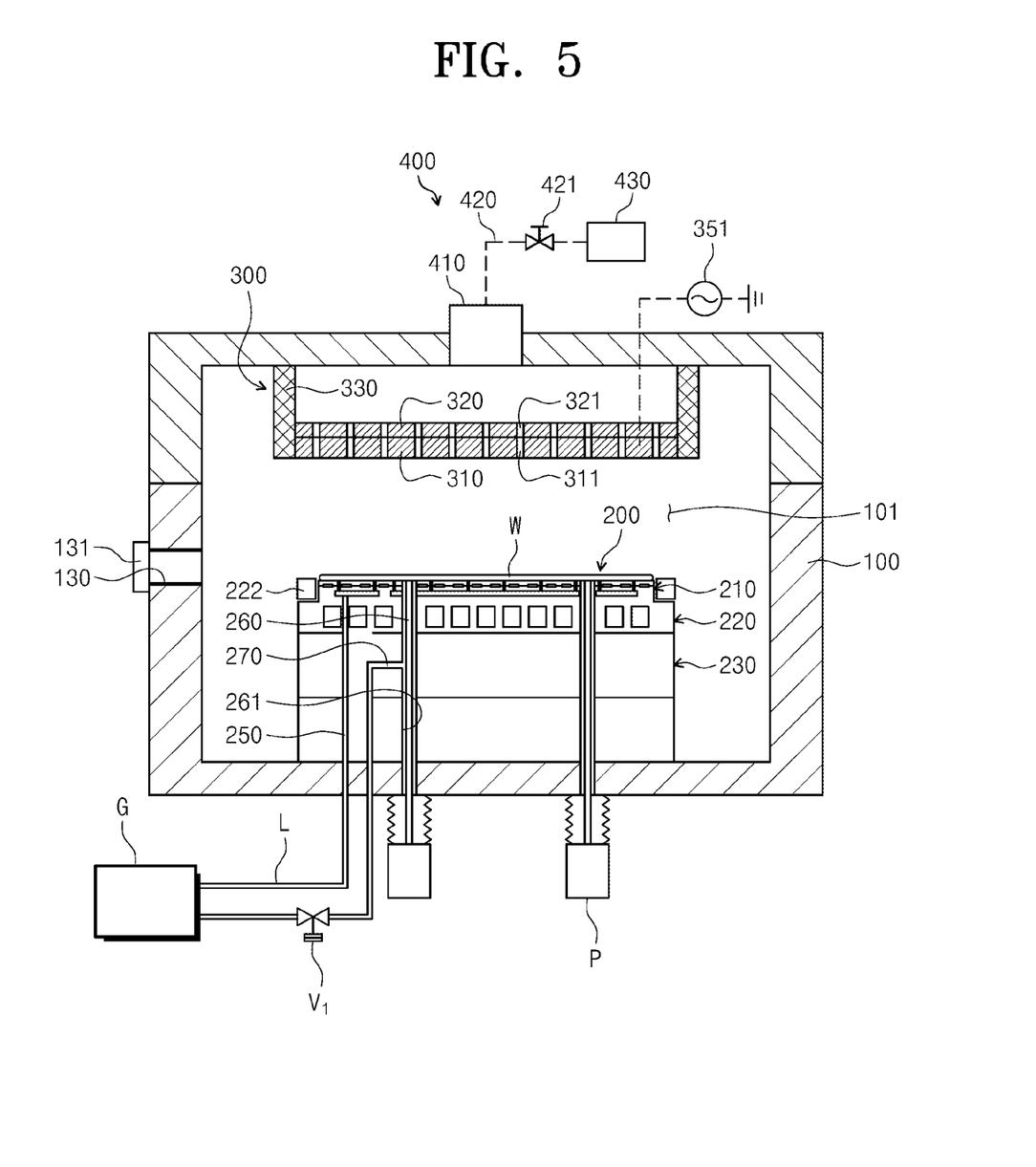
FIG. 5 is a sectional view illustrating a substrate treating apparatus according to another embodiment of the inventive concept.
Figure 6:
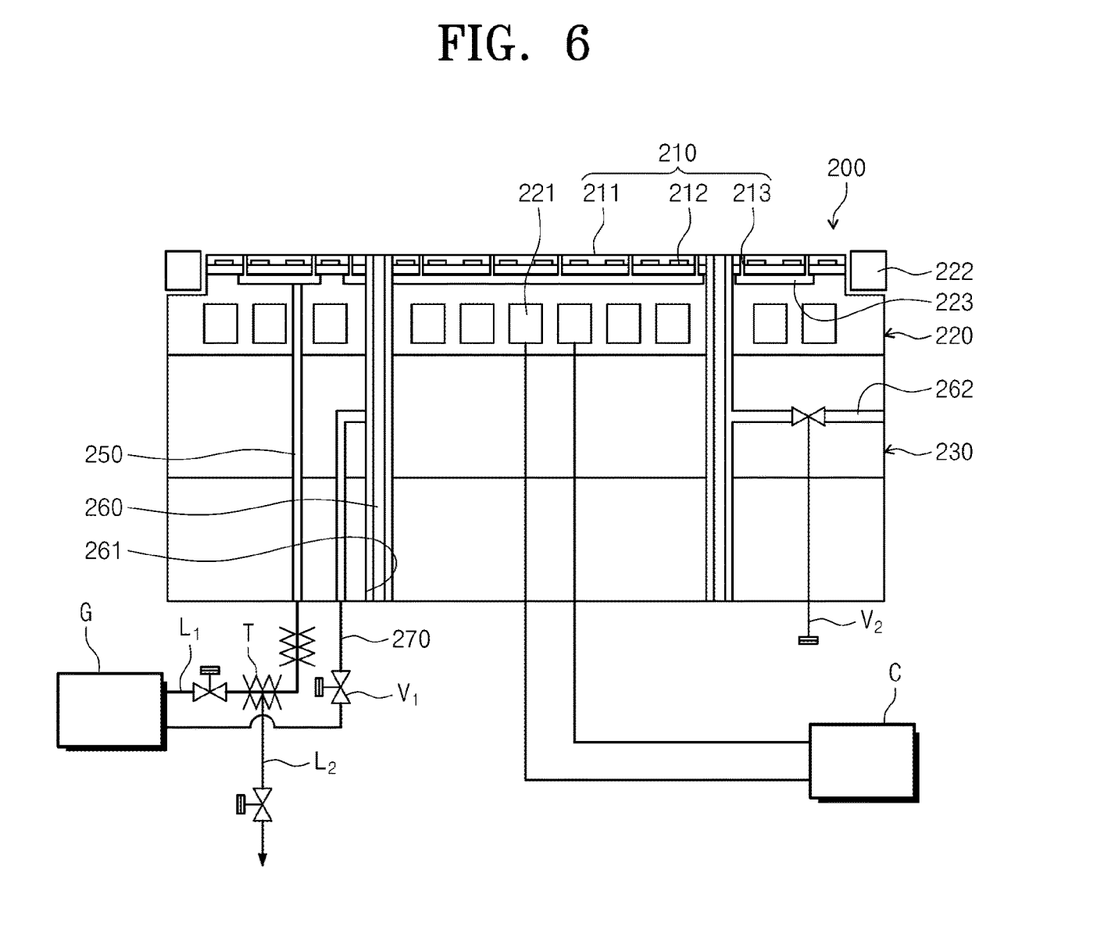
FIG. 6 is a sectional view illustrating a support unit provided in the substrate treating apparatus of FIG. 5.

In the above-mentioned embodiment, it has been described that the supply line 270 that supplies the heat treating gas to the pin hole 261 is branched from the gas line 250 that supplies the heat treating gas formed in the support unit 200. However, unlike this, as illustrated in FIGS. 5 and 6, the supply line 270 that supplies the heat treating gas to the pin hole 261 may be provided separately from the gas line 250.

According to an embodiment of the inventive concept, the temperature uniformity of the entire area of the substrate comprising an area corresponding to the pin hole may be improved during the process.

Further, according to an embodiment of the inventive concept, the substrate may be prevented from being damaged due to an excessive force applied to the substrate when the substrate is separated from the support unit.

The effects of the inventive concept are not limited to the above-mentioned effects, and the unmentioned effects can be clearly understood by those skilled in the art to which the inventive concept pertains from the specification and the accompanying drawings.

It is noted that the above embodiments are suggested for understanding of the inventive concept and do not limit the scope of the inventive concept, and various modifiable embodiments also fall within the scope of the inventive concept. For example, the elements illustrated in the embodiments of the inventive concept may be individually implemented, and some of the individual elements may be coupled to each other to be implemented. It should be understood that the technical protection range of the inventive concept has to be determined by the technical spirit of the claims, and the technical protection range of the inventive concept is not limited to the lexical meaning of the claims but reaches even to the equivalent inventions.

What is claimed is:

1. A substrate treating apparatus comprising:
    a chamber providing a treatment space to the interior of the substrate treating apparatus;
    a support unit located in the treatment space and on which a substrate is positioned;
    a gas supply unit configured to eject a process gas into the treatment space; and
    a plasma generating unit configured to generate plasma from the process gas,
    wherein the support unit comprises:
        a lift pin configured to elevate through a pin hole formed in the support unit and configured to deliver the substrate to the support unit or receive the substrate from the support unit;
        a gas line formed in the support unit to supply a heat transfer gas between the substrate positioned on the support unit and the support unit, the gas line extending through the support unit to an upper surface of the support unit and separated from the lift pin and pin hole, the gas line formed to supply the heat transfer gas to a space between a bottom surface of the substrate and the upper surface of the support unit; and
        a supply line configured to supply the heat transfer gas to the pin hole,
    wherein the support unit comprises:
        an electrostatic chuck configured to suction the substrate by an electrostatic force;
        an electrode plate disposed below the electrostatic chuck, the electrode plate comprising a plurality of refrigerant passages;
        an insulation plate disposed below the refrigerant passages of the electrode plate; and
        wherein the supply line is branched from the gas line in the insulation plate and is connected to the pin hole in the insulation plate.

2. The substrate treating apparatus of claim 1, wherein the heat transfer gas is helium.

3. The substrate treating apparatus of claim 1, wherein a valve configured to open and close the interior of the supply line is installed in the supply line.

4. The substrate treating apparatus of claim 1, wherein a ventilation line that discharges the gas in the interior of the pin hole is connected to the pin hole and a valve that opens and closes the interior of the ventilation line is installed in the ventilation line.

5. The substrate treating apparatus of claim 4, wherein the ventilation line is configured to vent the gas into the treatment space.

6. The substrate treating apparatus of claim 1, wherein a plurality of pin holes are provided in the support unit and a plurality of supply lines are provided in the pin holes, respectively.

7. The support unit of claim 1, further comprising:
    a ventilation line that vents the gas in the interior of the pin hole into the treatment space, the ventilation line arranged in the insulation plate and connected to the pin hole; and
    a valve that opens and closes the interior of the ventilation line is installed along the ventilation line within the insulation plate.

8. A support unit that supports a substrate, the support unit comprising:

a lift pin configured to elevate through a pin hole formed in the support unit and configured to deliver the substrate to the support unit or receive the substrate from the support unit;

a gas line formed in the support unit to supply a heat transfer gas to a space between a bottom surface of the substrate positioned on the support unit and an upper surface of the support unit, the gas line extending through the support unit to the upper surface of the support unit and separated from the lift pin and pin hole; and a supply line configured to supply the heat transfer gas to the pin hole, wherein the support unit comprises:
- an electrostatic chuck configured to suction the substrate by an electrostatic force;
- an electrode plate disposed under the electrostatic chuck, the electrode plate comprising a plurality of refrigerant passages; and
- an insulation plate disposed below the refrigerant passages of the electrode plate, wherein the gas line is configured to pass thorough the electrostatic chuck, the electrode plate, and the insulation plate, wherein the lift pin is configured to elevate through a pin hole extending from the electrostatic chuck to the insulation plate in the interior thereof, and wherein the supply line is branched from the gas line in the insulation plate and is connected to the pin hole in the plate.

9. The support unit of claim 8, wherein the supply line is branched from the gas line and a valve configured to open and close the interior of the supply line is installed in the supply line.

10. The support unit of claim 8, wherein a ventilation line that vents the gas in the interior of the pin hole is connected to the pin hole and a valve that opens and closes the interior of the ventilation line is installed in the ventilation line.

* * * * *